US009460786B2

(12) United States Patent
Kang

(10) Patent No.: US 9,460,786 B2
(45) Date of Patent: Oct. 4, 2016

(54) SEMICONDUCTOR INTEGRATED CIRCUIT DEVICE INCLUDING A LEAKAGE CURRENT SENSING UNIT AND METHOD OF OPERATING THE SAME

(71) Applicant: SK hynix Inc., Icheon-si Gyeonggi-do (KR)

(72) Inventor: Seok Joon Kang, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/594,395

(22) Filed: Jan. 12, 2015

(65) Prior Publication Data

US 2016/0125937 A1    May 5, 2016

(30) Foreign Application Priority Data

Oct. 30, 2014    (KR) .................. 10-2014-0148919

(51) Int. Cl.
| G11C 11/00 | (2006.01) |
| G11C 13/00 | (2006.01) |
| G11C 7/14 | (2006.01) |
| G11C 7/06 | (2006.01) |

(52) U.S. Cl.
CPC ............ *G11C 13/004* (2013.01); *G11C 7/062* (2013.01); *G11C 7/14* (2013.01); *G11C 13/0038* (2013.01); *G11C 2013/0054* (2013.01)

(58) Field of Classification Search
CPC .. G11C 7/065; G11C 7/062; G11C 7/114091
USPC ................................ 365/148, 206, 207, 208
See application file for complete search history.

(56) References Cited

U.S. PATENT DOCUMENTS

| 7,248,494 B2 * | 7/2007 | Oh .................. G11C 7/12 365/148 |
| 2013/0223134 A1 | 8/2013 | Yi et al. |

* cited by examiner

*Primary Examiner* — Son Dinh
(74) *Attorney, Agent, or Firm* — William Park & Associates Ltd.

(57) ABSTRACT

A semiconductor integrated circuit device configured for sensing a pure leakage current of a cell array and improving a read error is disclosed. The semiconductor integrated circuit device may include a leakage current sensing unit configured for sensing a pure leakage current of a cell array, and a determination circuit unit configured for comparing a voltage level of the input node with a reference voltage and for determining a state of read data while in a read mode. Whereby an output current may be compared with a read current of the cell array at the input node, and the output current may include the summation of the pure leakage current and a reference current.

29 Claims, 11 Drawing Sheets

SEMICONDUCTOR INTEGRATED CIRCUIT DEVICE INCLUDING A LEAKAGE CURRENT SENSING UNIT AND METHOD OF OPERATING THE SAME

CROSS-REFERENCES TO RELATED APPLICATION

This application claims priority under 35 U.S.C. 119(a) to Korean application No. 10-2014-0148919, filed on Oct. 30, 2014, in the Korean intellectual property Office, which is incorporated by reference in its entirety as set forth in full.

BACKGROUND

1. Technical Field

Various embodiments may generally relate to a semiconductor integrated circuit device and a method of operating the same, and more particularly, to a semiconductor integrated circuit device including a leakage current sensing unit and a method of operating the same.

2. Related Art

With the rapid development of mobile and digital information communication as well as consumer-electronic industries, studies have shown that existing electronic charge-controlled devices have encountered limitations. Thus, there is a need to develop new functional memory devices apart from the existing electronic charge-controlled devices. In particular, next-generation memory devices with large capacity, ultra-high speed, and ultra-low power need to be developed to satisfy the demands on large capacity memories in main information apparatuses.

Currently, next-generation memory devices employ variable resistive memory devices using a resistive material as a memory medium. Typical examples of the variable resistive memory device are phase-change random access memories (PCRAMs), resistive RAMs (ReRAMs), and magneto-resistive RAMs (MRAMs).

The variable resistive memory devices may include memory cells. The memory cells may be configured of a switching device and a resistive device, and store data "0" or "1" according to a set/reset state of the resistive device.

Due to various factors, leakage currents may occur in the variable resistive memory devices. For example, the leakage current may occur in the fabrication of high integrated switching devices or in the formation of various thin films.

Such leakage currents may cause set/reset determination errors in the resistive memory devices.

SUMMARY

According to an embodiment, there is provided a semiconductor integrated circuit device. The semiconductor integrated circuit device may include a leakage current sensing unit configured for sensing a pure leakage current of a cell array, and a determination circuit unit configured for comparing a voltage level of an input node with a reference voltage and for determining a state of read data while in a read mode. Whereby an output current may be compared with a read current of the cell array at the input node, and the output current may include the summation of the pure leakage current and a reference current.

According to an embodiment, there is provided a method of operating a semiconductor integrated circuit device. The method may include measuring a leakage current of a cell array, applying a read voltage of the cell array and comparing a reference current to the leakage current reflected with a read current of the cell array, and comparing a comparison result with a reference voltage and determining a set state or a reset state of the cell array.

According to an embodiment, there is provided a semiconductor integrated circuit device. The semiconductor integrated circuit device may include a cell array including a plurality of word lines, a plurality of bit lines crossing the plurality of word lines, and variable resistors located at interconnections of the word lines and the bit lines. The semiconductor integrated circuit device may include a mode setting unit configured for setting a leakage current sensing mode by applying a first voltage to the cell array, and setting a read mode by applying a second voltage to the cell array. The semiconductor integrated circuit device may include a reference current generation unit configured for providing a reference current to an output node while in the read mode. The semiconductor integrated circuit device may include a leakage current generation unit including a capacitor loop, and configured for generating a leakage current according to a charge amount stored in the capacitor loop and transferring the leakage current to the output node while in the leakage current sensing mode. The semiconductor integrated circuit device may include a leakage current compensation unit configured for eliminating a component of the first voltage of the leakage current applied to the output node while in the read mode, and a determination circuit unit configured for comparing a voltage corresponding to a comparison result between a current of the cell array and a current of the output node with a reference voltage and determines a set state or a reset state of the cell array.

According to an embodiment, there is provided a semiconductor integrated circuit device. The semiconductor integrated circuit device may include a cell array including a plurality of word lines, a plurality of bit lines crossing the plurality of word lines, access devices located at interconnections of the word lines and the bit lines, and data storage units of resistance values selectively varied according to operations of the access devices. The semiconductor integrated circuit device may include a leakage current generation unit including a capacitor loop, and configured to generate a leakage current according to a charge amount stored in the capacitor loop and to transfer the leakage current to an output node in a leakage current sensing mode. The semiconductor integrated circuit device may include a determination circuit unit configured for comparing a voltage corresponding to a comparison result between a current of the cell array and a current of the output node with a reference voltage and configured to determine a set state or a reset state of the cell array.

According to an embodiment, there is provided a semiconductor integrated circuit device. The semiconductor integrated circuit device may include a cell array, a leakage current generation unit including a capacitor loop, and configured for generating a leakage current according to a charge amount stored in the capacitor loop and for transferring the leakage current to an output node in a leakage current sensing mode. The semiconductor integrated circuit device may include a conversion unit configured for receiving the leakage current, performing digital coding on the leakage current, and storing the digital-coded leakage current, and providing the stored leakage current to the output node while in a read mode. The semiconductor integrated circuit device may include a determination circuit unit configured for comparing a voltage corresponding to a comparison result between a read provided from the cell array and a current of the output node with a reference voltage and for determining a state of read data in the read mode.

According to an embodiment, there is provided an electronic apparatus including a processor coupled to a bus, and a memory coupled to a bus and configured to store data for the operation of the processor and data accessed through the bus. The memory may include a semiconductor integrated circuit device. The semiconductor integrated circuit device may include a leakage current sensing unit configured for sensing a pure leakage current of a cell array, and a determination circuit unit configured for comparing a voltage level of an input node with a reference voltage and for determining a state of read data while in a read mode. Whereby an output current may be compared with a read current of the cell array at the input node, and the output current may include the summation of the pure leakage current and a reference current.

DETAILED DESCRIPTION

Figure 1:
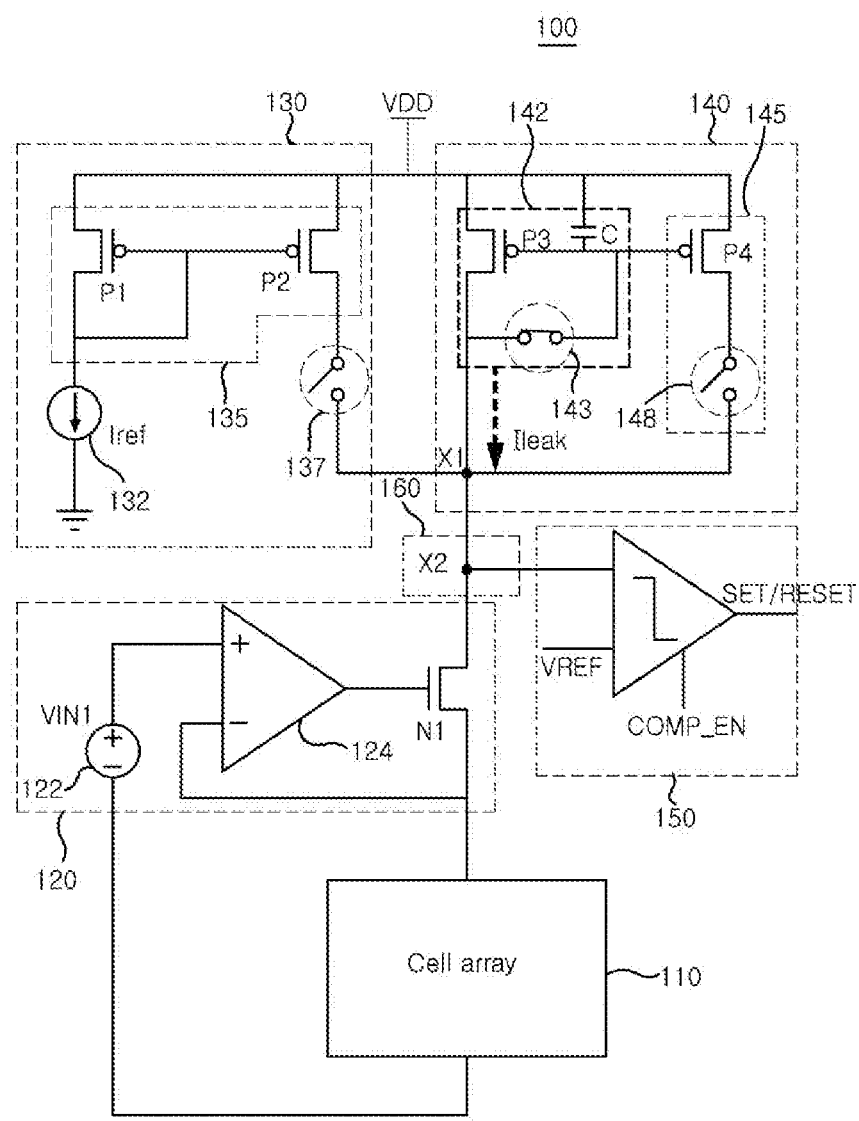
FIGS. 1 and 2 are circuit diagrams illustrating a representation of a semiconductor integrated circuit device including a leakage current sensing unit according to an embodiment.

Hereinafter, various examples of embodiments will be described with reference to the accompanying drawings. Various examples of the embodiments are described herein with reference to cross-sectional illustrations that are schematic illustrations of the examples of the embodiments (and intermediate structures). As such, variations from the shapes of the illustrations as a result, for example, of manufacturing techniques and/or tolerances, are to be expected. Thus, the examples of the various embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Various embodiments are described herein with reference to cross-section and/or plan illustrations that are schematic illustrations of idealized embodiments. Although certain examples of the various embodiments will be illustrated and described, it will be appreciated by those of ordinary skill in the art that changes may be made in these exemplary embodiments without departing from the principles and spirit of the application.

Referring to FIG. 1, a semiconductor integrated circuit device 100 may include a cell array 110, a mode setting unit 120, and a reference voltage generation unit 130. The semiconductor integrated circuit device 100 may include a leakage current sensing unit 140, a determination circuit unit 150, and a current comparison unit 160.

The cell array 110 may include crossbar array type memory cells including data storage units. The data storage units may include resistive materials interposed, for example, at intersections of a plurality of word lines and a plurality of bit lines. In the examples including the crossbar array type memory cells, one memory cell may be selected according to the selection of a corresponding word line and a corresponding bit line.

The mode setting unit 120 may determine a leakage current measurement mode and a read mode according to an input voltage. The mode setting unit 120 may include a voltage source 122, a comparison unit 124, and a switching unit N1.

The voltage source 122 may provide a first voltage VIN1 or a second voltage VIN2 according to a setting mode. For example, the first voltage VIN1 may be a voltage smaller than or equal to a threshold voltage VTH. The threshold voltage can drive unit memory cells (not illustrated) of the cell array 110. Thus, theoretically, when the first voltage VIN1 is applied, the unit memory cells of the cell array 110 should be not driven. The second voltage VIN2 may be a read voltage Vread. The read voltage Vread can read data stored in the cell array 110.

The reference current generation unit 130 may include a current source 132, a current mirror unit 135, and a first switch 137.

The current source 132 may be coupled between a ground terminal and the current mirror unit 135. The current source 132 may provide a reference current Iref provided to the cell array 110.

The current mirror unit 135 may include a first PMOS transistor P1 and a second PMOS transistor P2. The first PMOS transistor P1 and the second PMOS transistor P2 may be coupled in such a manner that the reference current Iref is mirrored to a drain of the second PMOS transistor P2. For example, a source of the first PMOS transistor P1 may be coupled to a power voltage terminal VDD. A drain of the first PMOS transistor P1 may be coupled to the current source 132. A gate of the first PMOS transistor P1 may be coupled to the current source 132 and simultaneously coupled to a gate of the second PMOS transistor P2. A source of the second PMOS transistor P2 may be coupled to the power voltage terminal VDD. A drain of second PMOS transistor P2 may be couple to the first switch 137. The first switch 137 may be coupled between the current mirror unit 135 and an output node X1. The first switch 137 may be designed to be opened when the first voltage VIN1 is provided from the voltage source 122 and to be closed when the second voltage VIN2 is provided.

The leakage current sensing unit 140 may include a leakage current generation unit 142, and a leakage current compensation unit 145.

The leakage current generation unit 142 may include a third PMOS transistor P3, a capacitor C, and a second switch 143. The third PMOS transistor P3 may be coupled between the power voltage terminal VDD and the output node X1. The capacitor C may be coupled between the power voltage terminal VDD and a gate of the third PMOS transistor P3. The second switch 143 may be coupled between the gate of the third PMOS transistor P3 and a drain of the third PMOS transistor P3. The second switch 143 may be designed to be closed when the first voltage VIN1 is applied and to be opened when the second voltage VIN2 is applied. That is, the leakage current generation unit 142 may be a capacitor loop coupled between the power voltage terminal VDD and the output node X1.

The leakage current compensation unit 145 may include a fourth PMOS transistor P4 and a third switch 148. The fourth PMOS transistor P4 may include a source coupled to the power voltage terminal VDD. A gate of the fourth PMOS transistor P4 may be commonly coupled to the gate of the third PMOS transistor P3 and the capacitor C. A drain of the fourth PMOS transistor P4 may be coupled to the third switch 148. The fourth PMOS transistor P4 may have a size as large as n-times a size of the third PMOS transistor P3. The numerical value n can be represented by Equation 1.

$$n = VIN2/VIN1 - 1 \quad \text{[Equation 1]}$$

The third switch 148 may be coupled between the fourth PMOS transistor P4 and the output node X1. Like the first switch 137, the third switch 148 may be designed to be opened when the first voltage VIN1 is applied and to be closed when the second voltage VIN2 is applied. For example, the first to third switches 137, 143, and 148 may be designed in such a manner that the first and third switches 137 and 148 may be opened in response to a read command and the second switch 143 may be closed in response to the read command.

The determination circuit unit 150 may compare an output voltage of the current comparison unit 160 and the reference voltage Vref in response to an enable signal COMP_EN and output a set/reset signal SET/RESET.

Figure 3:
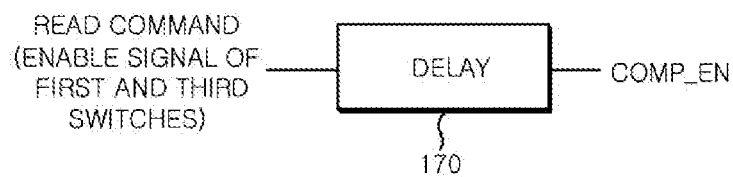
FIG. 3 is a circuit diagram illustrating a representation of an enable signal generation unit according to an embodiment.

The enable signal COMP_EN is a signal generated by delaying the read command, that is, an enable signal (or the second voltage) of the first and third switches 137 and 148 by a certain time through a delay circuit unit 170 as illustrated in FIG. 3. The delay circuit unit 170 may be a general delay circuit. Therefore, the delay amount of the delay circuit unit may be determined by considering a measuring time of a leakage current Ileak, a transfer time in which an output current Is and a read current Iread are transferred to an input node X2, or the like.

The current comparison unit 160 may be configured of the input node X2. The current comparison unit 160 may compare a current provided to the input node X2 from the output node X1 with the read current Iread provided from the cell array 110, and provide a voltage corresponding to a comparison result value as an input signal of the determination circuit unit 150.

An operation of sensing and compensating a leakage current in the semiconductor integrated circuit device 100 will be described.

Figure 4:
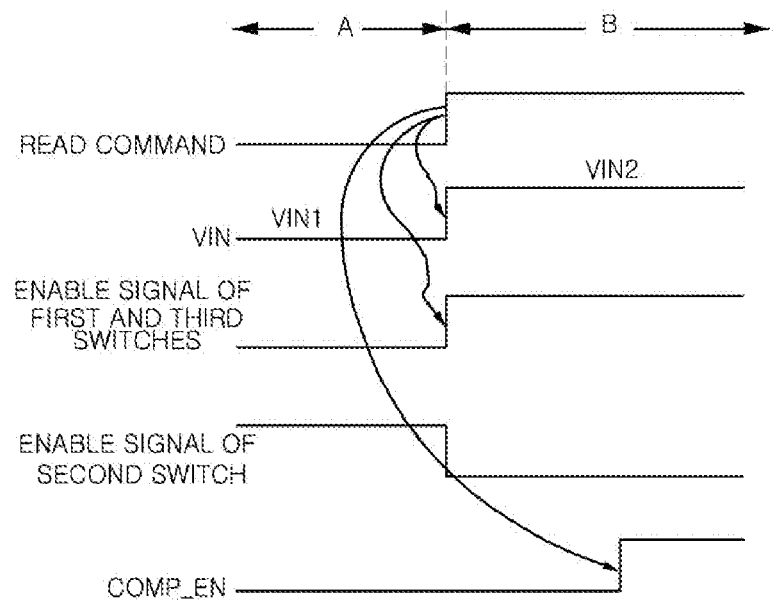
FIG. 4 is a timing chart illustrating a representation of an operation of a semiconductor integrated circuit device according to an embodiment.

Referring to FIGS. 1 and 4, the first voltage VIN1 is applied through the voltage source 122 during a leakage current sensing mode A. Thus, the first and third switches 137 and 148 are opened and the second switch 143 is closed. Accordingly, a voltage corresponding to the leakage current Ileak is applied to the capacitor C of the leakage current sensing unit 140 and charges corresponding to the leakage current are charged in the capacitor C. According to the amount of charge charged in the capacitor C, the third PMOS transistor P3 is driven, and thus the leakage current Ileak is generated. At this time, since the first and third switches 137 and 148 are opened, only the leakage current Ileak flows in the output node X2, and the charges corresponding to the leakage current are continuously charged in the capacitor C in the leakage current sensing mode A.

Figure 2:
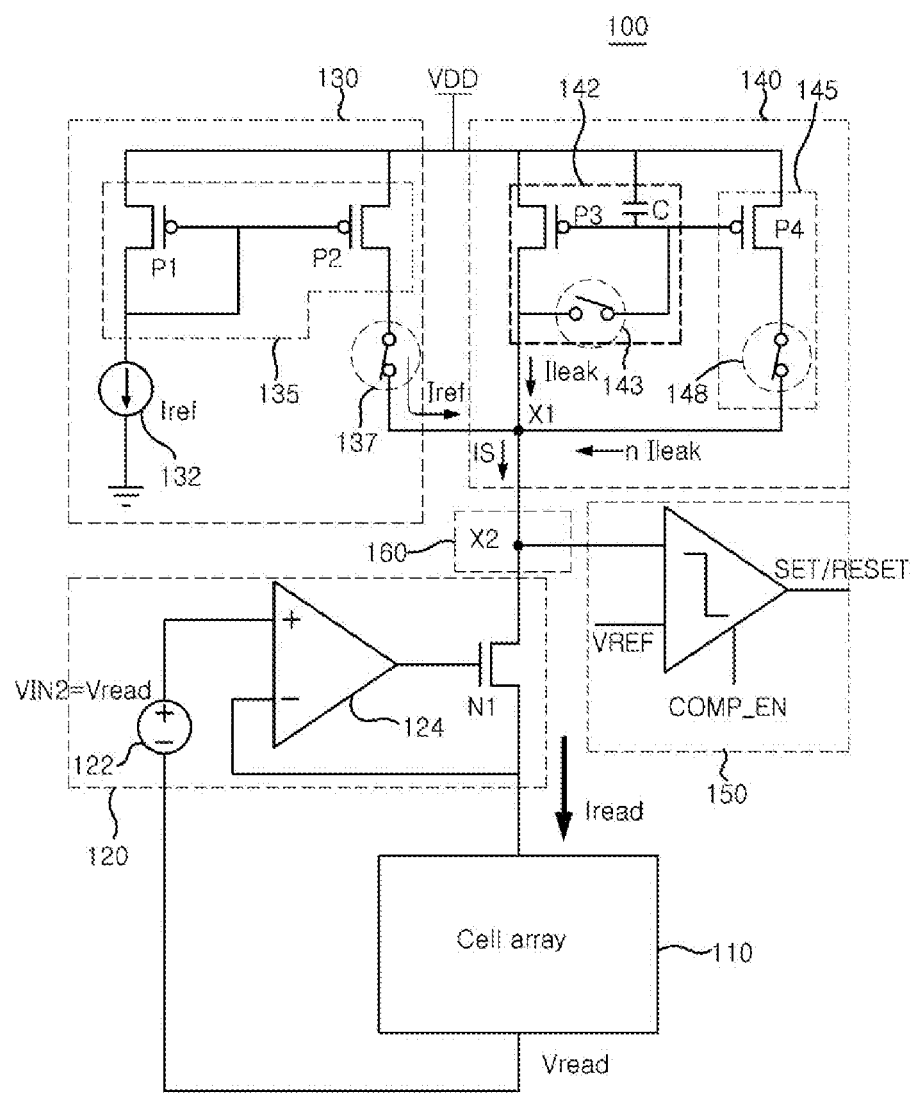

An operation of a read mode B whereby the second voltage VIN2, that is, the read voltage VREAD is applied will be described with reference to FIGS. 2 and 3.

As the second voltage VIN2 is applied, the first and third switches 137 and 148 are closed, and the second switch 143 is opened. As the first and third switches 137 and 148 are closed, the reference Iref passing through the first switch 137, the output current Ileak of the third PMOS transistor P3 driven by the voltage charged in the capacitor C, and the output current nIleak of the third switch 148 are collected at the output node X1. At this time, since the output current nIleak of the third switch 148 corresponds to (VIN2/VIN1−1)Ileak, the current Is (hereinafter, referred to as an output current) of the output node X1 becomes Iref+Ileak+(VIN2/VIN1−1)Ileak, that is, Iref+(VIN2/VIN1)Ileak, and the output current Is is transferred to the input node X2 of the current comparison unit 160. Here, the size of the fourth transistor P4 is set to (VIN2/VIN1−1)Ileak to eliminate the component of the first voltage VIN1 for causing the leakage current. As a result, the output current Is may be interpreted as a reference current to which a pure leakage current is reflected. The leakage current compensation includes summing n-times a leakage current to the measured leakage current, wherein n=VIN2/VIN1−1, VIN1 is the input voltage, and the VIN2 is the read voltage.

As the read command is applied, the read current Iread of the cell array 110 is transferred to the input node X2 of the current comparison unit 160, and the current comparison unit 160 compares the output current Is with the read current Iread. For example, the current comparison unit 160 may not include a specific circuit, and may be simply configured of only a node. That is, a potential of the input node X2 may be changed according to the variation of the charge amount provided from both sides of the input node X2. Thus, the virtual current comparison function may be performed in the input node X2.

When the read current Iread is less than the output current Is, the potential of the input node X2 may be increased. When the read current Iread is greater than the output current Is, the output current Is is drained toward the cell array, and thus the potential of the input node X2 may be lowered.

After the enable signal COMP_EN is input, the determination circuit unit 150 compares a voltage of the input node X2 and the reference voltage VREF and outputs a set signal SET or a reset signal RESET.

According to an embodiment, the leakage information of the cell array may be sensed before the read operation of the cell array is performed, and the amount of the leakage current previously detected may be compensated in an actual read mode. Therefore, the read error of the cell array due to the leakage current may be prevented.

Figure 5:
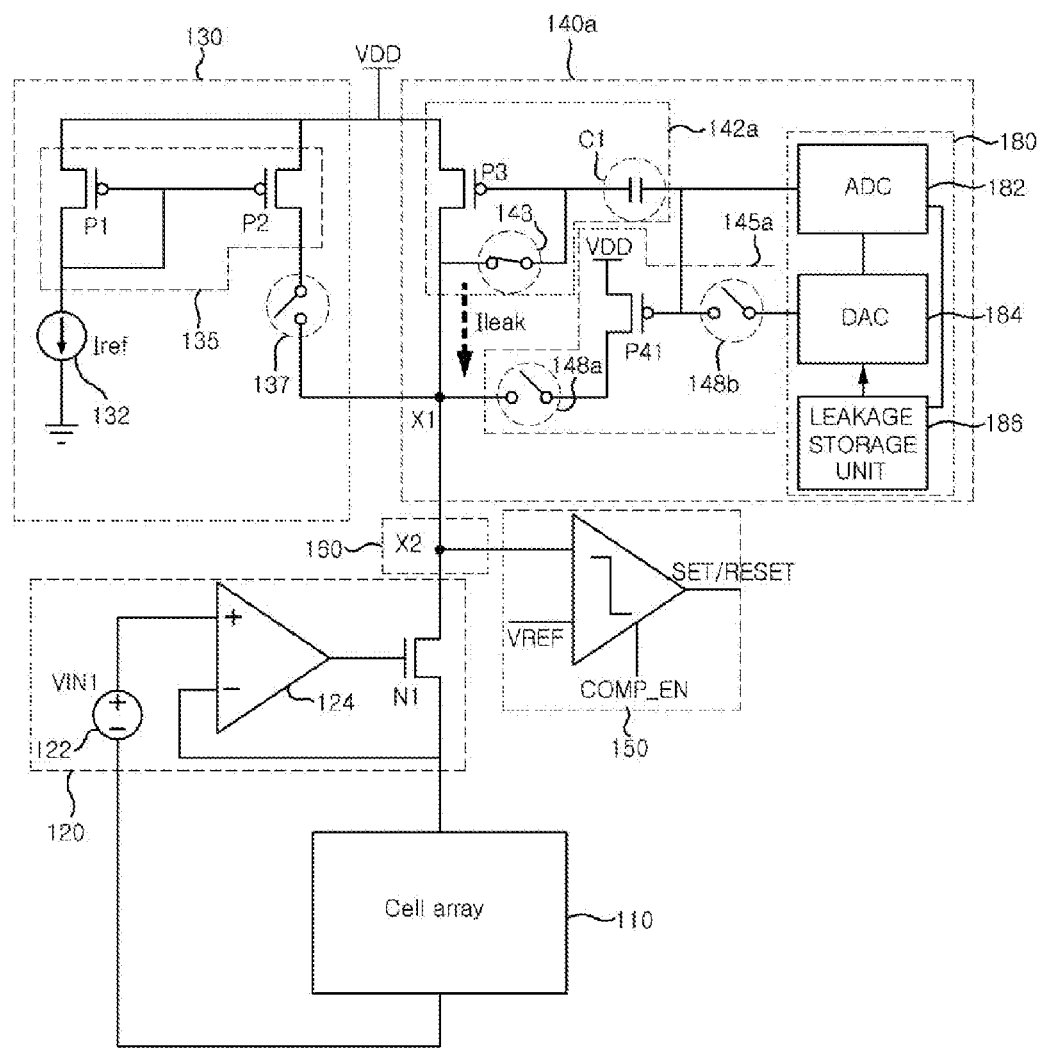
FIG. 5 is a circuit diagram illustrating a representation of a semiconductor integrated circuit device including a conversion unit according to an embodiment.

Referring to FIG. 5, a leakage current sensing unit 140a may include a leakage current generation unit 142a, a leakage current compensation unit 145a, and a conversion unit 180. Configurations of a cell array 110, a mode setting unit 120, a reference current generation unit 130, a determination circuit unit 150, and a current comparison unit 160 may be substantially the same as those of the cell array 110, the mode setting unit 120, the reference current generation unit 130, the determination circuit unit 150, and the current comparison unit 160, respectively, illustrated in FIGS. 1 and 2.

The leakage current generation unit 142a in an embodiment may include a third PMOS transistor P3 and a second switch 143. The third PMOS transistor P3 may be coupled between a power voltage terminal VDD and an output node X1. The second switch 143 may be coupled between a gate and a drain of the third PMOS transistor P3. The second switch 143 may be designed to be closed when a first voltage VIN1 is applied and to be opened when a second voltage VIN2 is applied. A virtual capacitor C1 may be formed between the gate of the third PMOS transistor P3 and the leakage current compensation unit 145a.

The leakage current compensation unit 145a may include a fourth PMOS transistor P41, a third switch 148a, and a fourth switch 148b. The fourth PMOS transistor P41 in an embodiment may be enabled by a voltage charged in the virtual capacitor C1 to switch the power voltage VDD. The third switch 148a may be coupled between the fourth PMOS transistor P41 and the output node X1. The fourth switch 148b may be coupled between a gate of the fourth PMOS transistor P41 and the conversion unit 180. The third and fourth switches 148a and 148b may be designed to be opened when the first voltage VIN1 is applied and to be closed when the second voltage VIN2 is applied.

The conversion unit 180 may include an analog to digital converter (ADC) 184, a digital to analog converter (DAC) 184, and a leakage storage unit 186.

The ADC 182 receives a capacitance value stored in the virtual capacitor C1 and converts the capacitance value to a digital code.

The DAC 184 receives the digital code input from the ADC 182 and generates a current for driving the leakage current compensation unit 145a.

The leakage storage unit 186 may store the digital code corresponding to the leakage current provided from the ADC 182, and then provide the digital code to the DAC 184 in the read mode.

By the installation of the conversion unit 180, the leakage current is stored and continuously used through only one sensing operation of the leakage current, and thus it may not be necessary to sense the leakage current whenever the read mode is performed. Therefore, the time required for sensing the leakage current may be reduced.

At this time, at least one of the ADC 182 and the DAC 184 may further include a control unit (not illustrated) configured for eliminating the effect of the component of the first voltage VIN1. The control unit may include a general adder, a subtracter, an offset controller, or the like, and may control output levels of the ADC 182 and the DAC 184 according to the voltage level of the first voltage VIN1.

When at least one of the DAC 182 and the DAC 184 includes the control unit, the fourth PMOS transistor P41 may be formed substantially to include the same size as the third PMOS transistor P3.

However, when the control unit is not included in any one of the ADC 182 and the DAC 184, the fourth PMOS transistor P41 may be configured in such a manner that a size thereof is as large as n-times the size of the third PMOS transistor P3 (see also Equation 1 above) as in the embodiment of FIG. 1.

Figure 6:
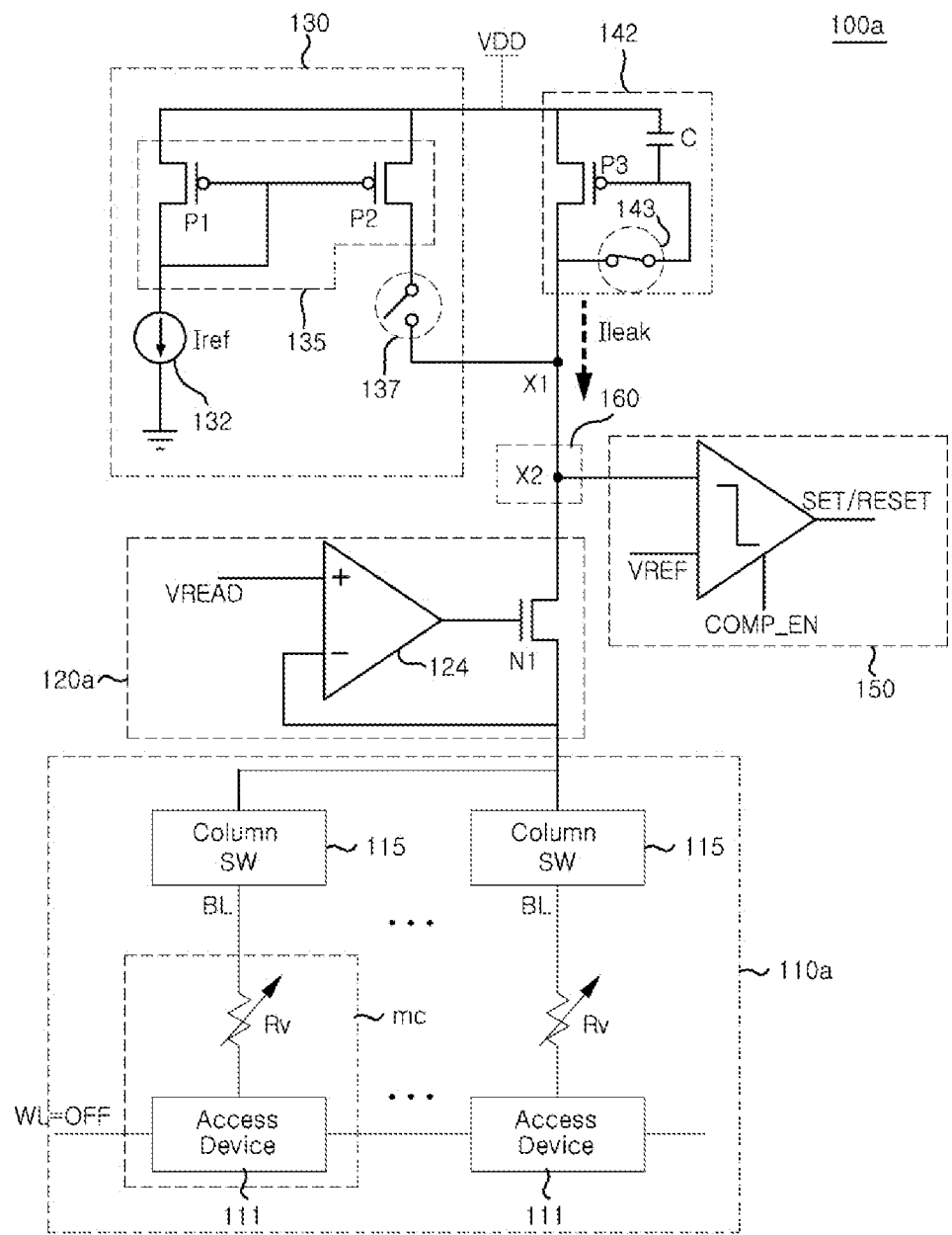
FIGS. 6 and 7 are circuit diagrams illustrating a representation of a semiconductor integrated circuit device including a leakage current generation unit according to an embodiment.
Figure 7:
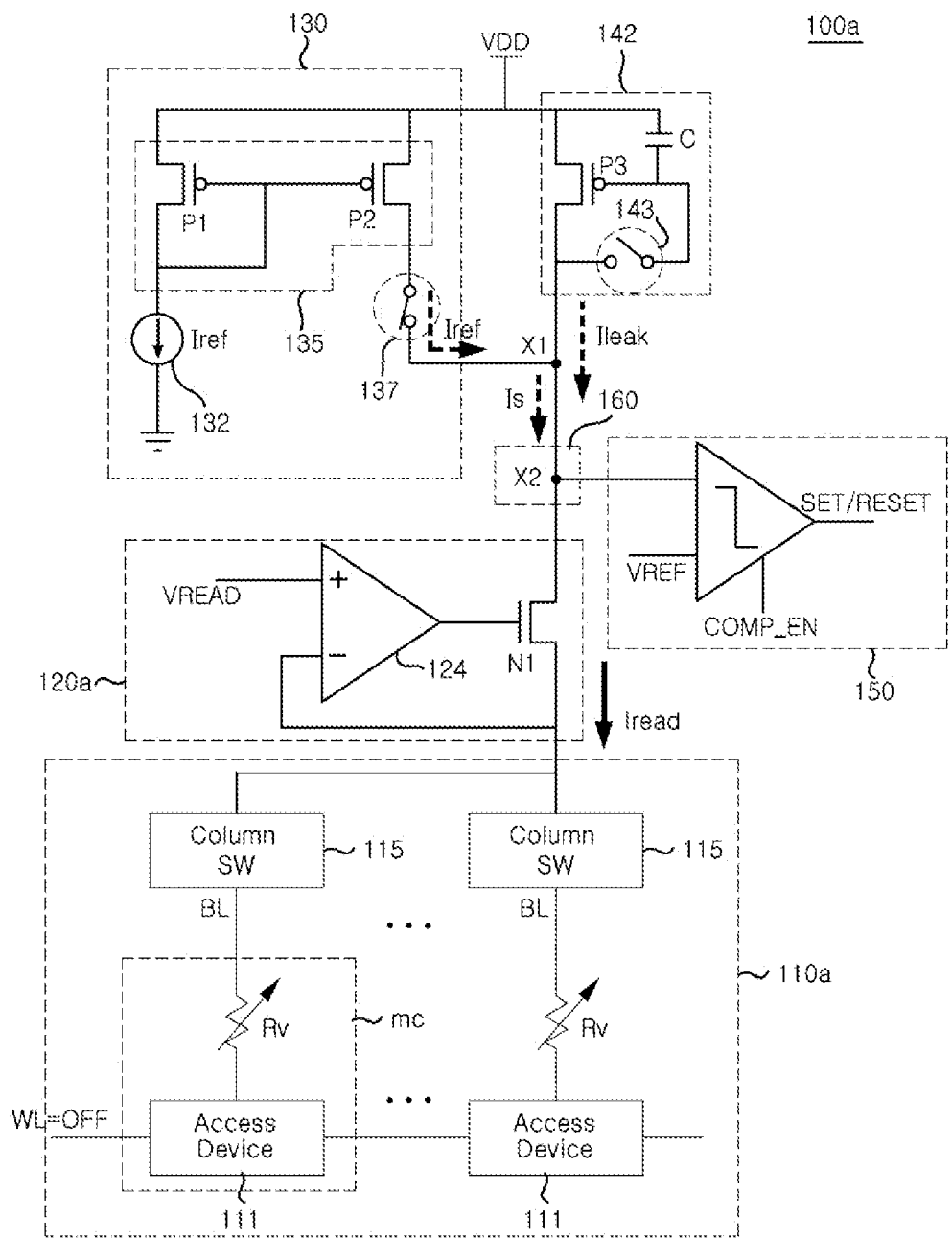

The cell array 110 including the crossbar array structure has been described in an embodiment, but a cell array 110a including an access device 111 may be applied as illustrated in FIGS. 6 and 7.

When the leakage current of the cell array 110a, including a plurality of word lines and a plurality of bit lines crossing the plurality of word lines, access devices 111 located at intersections of the word lines and the bit lines, and data storage units, for example, variable resistors which selectively store data by the access devices, is sensed, the leakage current generation condition may be provided by the word lines. Thus, it is not necessary to apply the first voltage VIN1 less than or equal to the threshold voltage, and it is not necessary to install the leakage current compensation unit which eliminates the effect of the first voltage VIN1.

The semiconductor integrated circuit device including its configuration will be described below with reference to FIG. 6. A semiconductor integrated circuit device 100a for sensing a leakage current may include a cell array 110a, a mode setting unit 120a, and a reference current generation unit 130. The semiconductor integrated circuit device 100a may include a leakage current generation unit 142, a determination circuit unit 150, and a current comparison unit 160.

The cell array 110a may be configured in such a manner that the access device 111 is located at an interconnection of a word line WL and a bit line BL and data is selectively stored in a variable resistor Rv according to whether or not the access device 111 is turned-on. The cell array 110a may include a column switch 115 for controlling the bit line BL, and a unit memory cell mc may include the access device 111 and the variable resistor Rv.

The mode setting unit 120a may be configured to compare the set read voltage VREAD with an output voltage of the cell array 110a and drive a switching unit N1. In an embodiment, since the mode setting unit 120a substantially provides the read voltage regardless of the operation mode, the mode setting unit 120a may be operated as a voltage regulator.

The reference current generation unit 130 may be designed to include substantially the same configurations and operations as those of the reference current generation unit 130 of FIG. 1.

The leakage current generation unit 142 may be coupled between a power voltage terminal VDD and an output node X1. The leakage current generation unit 142 may include a third PMOS transistor P3, a capacitor C, and a second switch 143. The third PMOS transistor P3 may be coupled between the power voltage terminal VDD and the output node X1. The capacitor C may be coupled between the power voltage terminal VDD and a gate of the third PMOS transistor P3. The second switch 143 may be coupled between the gate of the third PMOS transistor P3 and a drain of the third PMOS transistor P3. The second switch 143 may be designed to be closed when the first voltage VIN1 is applied and to be opened when the second voltage VIN2 is applied.

The determination circuit unit 150 and the current comparison unit 160 may substantially include the same configurations as those of the determination circuit unit 150 and the current comparison unit 160 of FIG. 1.

The operation of the semiconductor integrated circuit device 100a having the configuration will be operated below.

Figure 8:
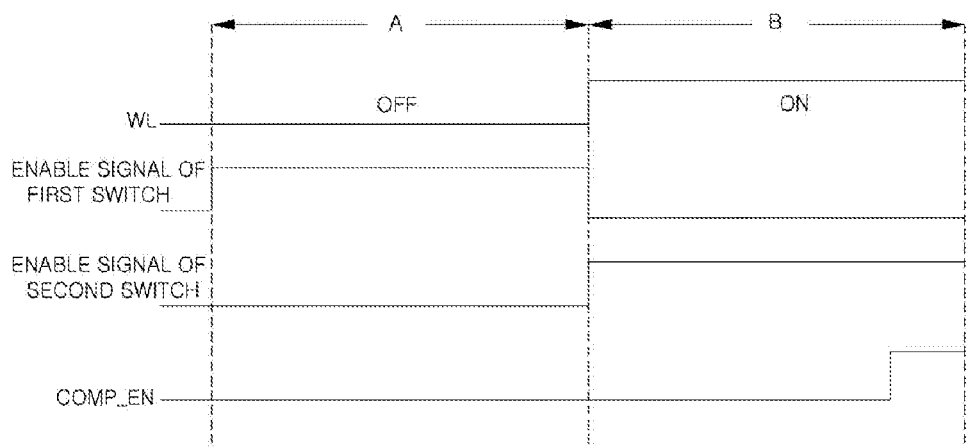
FIG. 8 is a timing chart illustrating a representation of an operation of a semiconductor integrated circuit device according to an embodiment.

As illustrated in FIGS. 6 and 8, the semiconductor integrated circuit device 100a turns off all the word lines WL of the cell array 110a, and enters the leakage current sensing mode A for generating the leakage current. Thus, the first switch 137 is opened, and the second switch 143 is closed. Charges corresponding to the leakage current are charged in the capacitor C of the leakage current generation unit 142. The third PMOS transistor P3 is driven according to the voltage charged in the capacitor C, and the leakage current Ileak is generated. Since the first switch 137 is opened, only the leakage current Ileak flows in the output node X1, and the charges corresponding to the leakage current are continuously charged in the capacitor C during the leakage current sensing mode A.

As illustrated in FIGS. 7 and 8, when the semiconductor integrated circuit device 100a enters the read mode B, the first switch 137 is closed, and the second switch 143 is opened. Thus, the output current Is, the output current Is being a sum of the reference current Iref and the leakage current Ileak, flows from the output node X1.

The current comparison unit 160 compares the output current Is provided from the output node X1 with the read current Iread provided from the cell array 110a, and provides a potential (a potential of an input node) according to a comparison result to the determination circuit unit 150.

The determination circuit unit 150 compares the voltage of the input mode X2 with the reference voltage Vref and outputs a set signal SET or a reset signal RESET in response to an enable signal COMP_EN.

In the semiconductor integrated circuit device according to an embodiment, since the leakage current condition may be provided by disabling of the word line WL is provided, and a circuit block applying a voltage for providing the leakage current and compensates the effect of the voltage may be omitted.

Further, by considering the leakage current Ileak measured through the above-described method, the reference current Iref may be controlled and provided to the cell array 110 and 110a.

Figure 9:
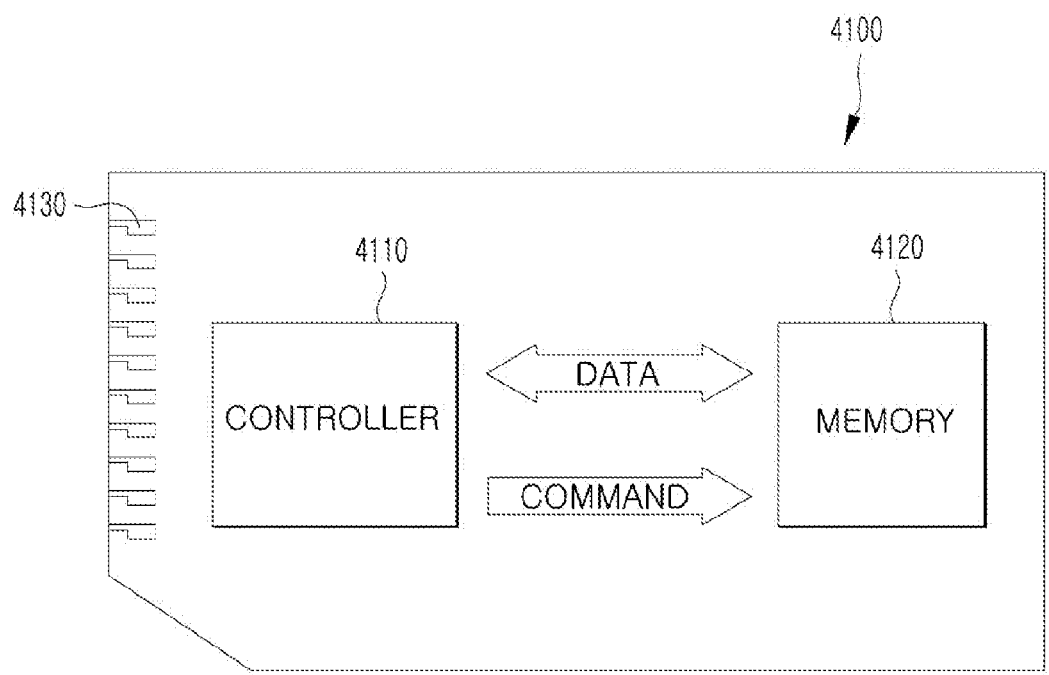
FIG. 9 is a schematic diagram illustrating a representation of an example of a memory card according to an embodiment.

FIG. 9 is a schematic diagram illustrating an example of a representation of a memory card having a semiconductor device according to various embodiments of the present technical spirit.

Referring to FIG. 9, a memory card system 4100 including a controller 4110, a memory 4120, and an interface member 4130 may be provided. The controller 4110 and the memory 4120 may be configured to exchange a command and/or data. For example, the memory 4120 may be used to store a command to be executed by the controller 4110 and/or user data.

The memory card system 4100 may store data in the memory 4120 or output data from the memory 4120 to the outside. The memory 4120 may include a semiconductor device according to any one of the above-described embodiments.

The interface member 4130 may function to input and output data from and to the outside. The memory card system 4100 may be a multimedia card (MMC), a secure digital card (SD) or a portable data storage device.

Figure 10:
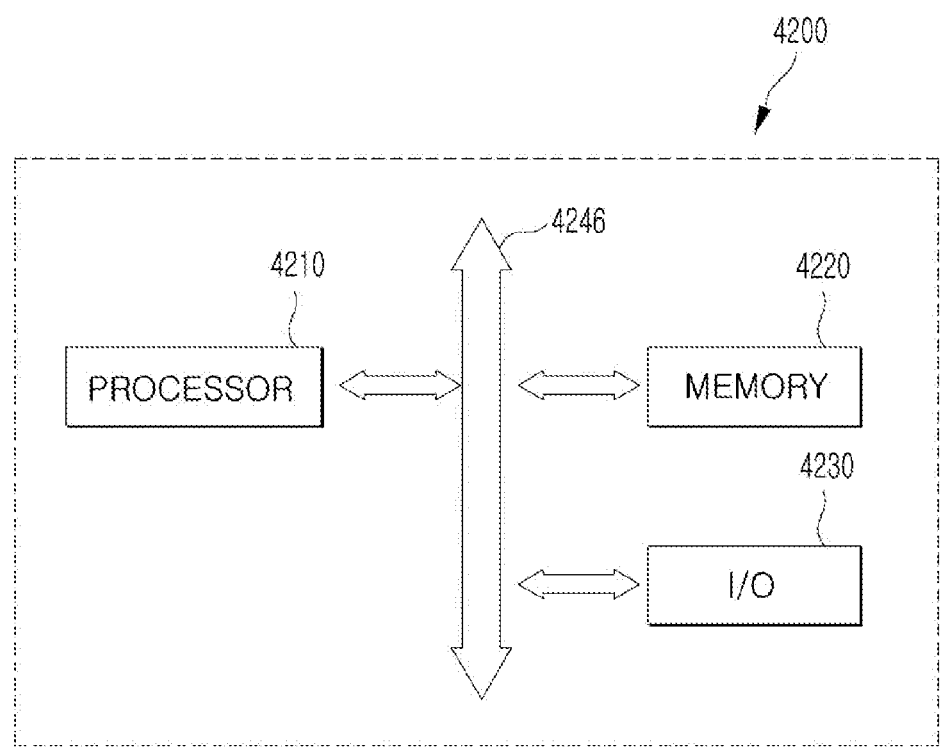
FIG. 10 is a block diagram illustrating an example of a representation of an electronic system according to an embodiment.

FIG. 10 is a block diagram illustrating an example of a representation of an electronic apparatus including a semiconductor device according to various embodiments of the present technical spirit.

Referring to FIG. 10, an electronic apparatus 4200 including a processor 4210, a memory 4220, and an input/output (I/O) device 4230 may be provided. The processor 4210, the memory 4220, and the I/O device 4230 may be electrically coupled through a bus 4246.

The memory 4220 may receive a control signal from the processor 4210. The memory 4220 may store a code and data for the operation of the processor 4210. The memory 4220 may be used to store data to be accessed through the bus 4246.

The memory 4220 may include a semiconductor device according to any one of the above-described embodiments. In order for detailed realization and modification, additional circuits and control signals may be provided.

The electronic apparatus 4200 may constitute various electronic control apparatuses which need the memory 4220. For example, the electronic apparatus 4200 may be used in a computer system or a wireless communication device, such as a personal digital assistant (PDA), a laptop computer, a portable computer, a web tablet, a wireless phone, a portable phone, a digital music player, an MP3 player, a navigator, a solid state disk (SSD), a household appliance, or any device capable of transmitting and receiving information under wireless circumstances.

Descriptions will be made below for the detailed realization and modified examples of the electronic apparatus 4200, with reference to FIGS. 11 and 12.

Figure 11:
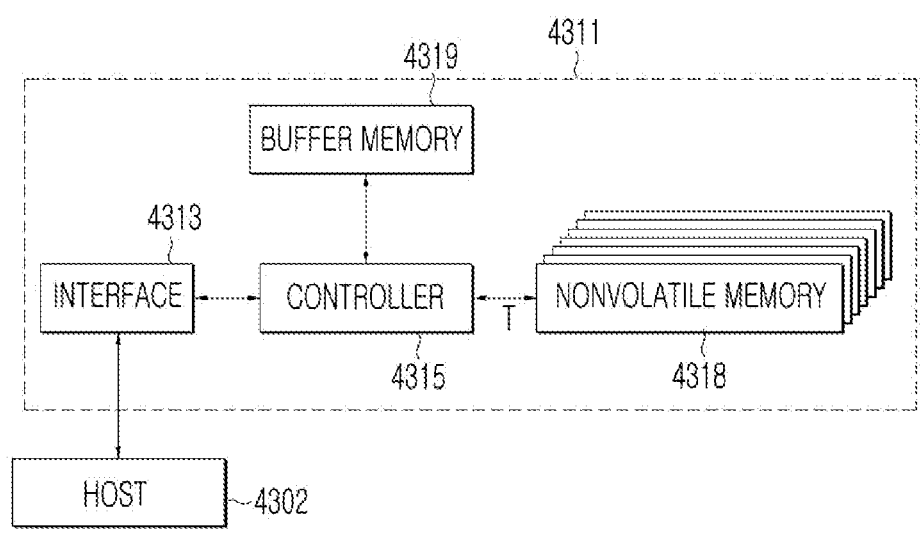
FIG. 11 is a block diagram illustrating an example of a representation of a data storage apparatus according to an embodiment.

FIG. 11 is a block diagram illustrating an example of a representation of a data storage apparatus including a semiconductor device according to various embodiments of the present technical spirit.

Referring to FIG. 11, a data storage apparatus 4311 such as a solid state disk (SSD) may be provided. The SSD 4311 may include an interface 4313, a controller 4315, a nonvolatile memory 4318, and a buffer memory 4319.

The SSD 4311 is an apparatus which stores information using a semiconductor device. The solid state disk 4311 is faster, has a lower mechanical delay or failure rate, and generates less heat and noise than a hard disk drive (HDD). Further, the SSD 4311 may be smaller and lighter than the HDD. The SSD 4311 may be widely used in a notebook PC, a net book, a desktop PC, an MP3 player, or a portable storage device.

The controller 4315 may be formed adjacent to the interface 4313 and may be electrically coupled to the interface 4313. The controller 4315 may be a microprocessor including a memory controller and a buffer controller. The nonvolatile memory 4318 may be formed adjacent to the controller 4315 and may be electrically coupled to the controller 4315 via a connection terminal T. The data storage capacity of the SSD 4311 may correspond to the nonvolatile memory 4318. The buffer memory 4319 may be formed adjacent to the controller 4315 and may be electrically coupled to the controller 4315.

The interface 4313 may be electrically coupled to a host 4302, and may function to transmit and receive electrical signals such as data. For example, the interface 4313 may be a device which uses the same standard as SATA, IDE, SCSI, and/or a combination thereof. The nonvolatile memory 4318 may be electrically coupled to the interface 4313 via the controller 4315.

The nonvolatile memory 4318 may function to store the data received through the interface 4313.

The nonvolatile memory 4318 may include a semiconductor device according to any one of the above-described embodiments. The nonvolatile memory 4318 has a characteristic that the data stored therein are retained even when power supply to the SSD 4311 is interrupted.

The buffer memory 4319 may include a volatile memory. The volatile memory may be a DRAM and/or an SRAM. The buffer memory 4319 has relatively higher operation speed than the nonvolatile memory 4318.

The data processing speed of the interface 4313 may be relatively faster than the operation speed of the nonvolatile memory 4318. The buffer memory 4319 may function to temporarily store data. The data received through the interface 4313 may be temporarily stored in the buffer memory 4319 via the controller 4315, and then, may be permanently stored in the nonvolatile memory 4318 in conformity with the data recording speed of the nonvolatile memory 4318.

The data frequently used among the data stored in the nonvolatile memory 4318 may be read in advance and may be temporarily stored in the buffer memory 4319. Namely, the buffer memory 4319 may function to increase the effective operation speed of the SSD 4311 and reduce an error occurrence rate.

Figure 12:
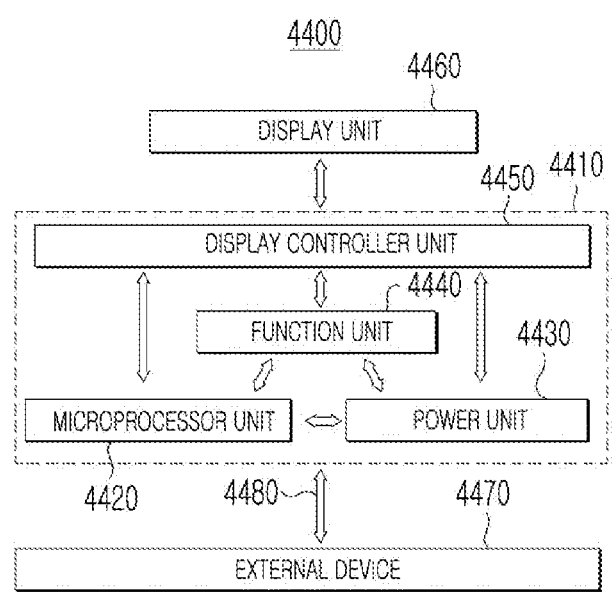
FIG. 12 is a block diagram illustrating an example of a representation of an electronic apparatus according to an embodiment.

FIG. 12 is a block diagram illustrating an example of a representation of an electronic apparatus including a semiconductor device according to various embodiments of the present technical spirit.

Referring to FIG. 12, an electronic system 4400 including a body 4410, a microprocessor unit 4420, a power unit 4430, a function unit 4440, and a display controller unit 4450 may be provided.

The body 4410 may be a mother board which is formed of a printed circuit board (PCB). The microprocessor unit 4420, the power unit 4430, the function unit 4440, and the display controller unit 4450 may be mounted on the body 4410. A display unit 4460 may be disposed inside the body 4410 or outside the body 4410. For example, the display unit 4460 may be disposed on a surface of the body 4410, and display the image processed by the display controller unit 4450.

The power unit 4430 may function to receive a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430 and control the function unit 4440 and the display unit 4460. The function unit 4440 may perform various functions of the electronic system 4400. For example, when the electronic system 4400 is a portable phone, the function unit 4440 may include various components capable of performing portable phone functions, such as output of an image to the display unit 4460 or output of a voice to a speaker, by dialing or communication with an external device 4470. When a camera is mounted together, the function unit 4440 may serve as a camera image processor.

When the electronic system 4400 is electrically coupled to a memory card or the like to increase capacity, the function unit 4440 may be a memory card controller. The function unit 4440 may exchange signals with the external device 4470 through a wired or wireless communication unit 4480. When the electronic system 4400 needs a universal serial bus (USB) or the like to expand functions thereof, the function unit 4440 may serve as an interface controller. Any one semiconductor device among the semiconductor devices according to the above-described embodiments may be applied to at least any one of the microprocessor unit 4420 and the function unit 4440.

The above embodiments are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor integrated circuit device comprising:
   a leakage current sensing unit configured to sense a pure leakage current of a cell array; and
   a determination circuit unit configured to compare a voltage level of an input node with a reference voltage and determine a state of read data while in a read mode,
   wherein the voltage level of the input node is decided by comparing an output current and a read current,
   wherein the output current is decided by summing the pure leakage current and a reference current.

2. The semiconductor integrated circuit device of claim 1, wherein the determination circuit unit is configured to compare the voltage level of the input node with the reference voltage in response to an enable signal and output a set/reset signal.

3. The semiconductor integrated circuit device of claim 1, wherein the leakage current sensing unit includes a leakage current generation unit including a capacitor loop coupled to a power voltage terminal.

4. The semiconductor integrated circuit device of claim 3, wherein the leakage current generation unit includes:
   a capacitor coupled to the power voltage terminal;
   a transistor coupled to the power voltage terminal and driven by a charged voltage of the capacitor loop; and
   a switch coupled between a gate and a drain of the transistor and configured to be closed when a leakage current is measured.

5. The semiconductor integrated circuit device of claim 1, wherein, when the cell array includes a crossbar array structure including a plurality of word lines, a plurality of bit lines crossing the plurality of word lines, and variable resistors located at intersections of the word lines and the bit lines,
   the leakage current sensing unit includes:
   a leakage current generation unit configured to apply an input voltage less than or equal to a threshold voltage of the cell array and cause a leakage current; and
   a leakage current compensation unit configured to reflect a ratio of a voltage while in the read mode to a component of the input voltage to the leakage current generated in the leakage current generation unit, and generate the pure leakage current.

6. The semiconductor integrated circuit device of claim 5, wherein the leakage current generation unit includes:
   a capacitor coupled to a power voltage terminal;
   a first transistor coupled to the power voltage terminal and driven by a charged voltage of the capacitor loop; and
   a first switch coupled between a gate and a drain of the first transistor and configured to be closed when the leakage current is measured.

7. The semiconductor integrated circuit device of claim 6, wherein the leakage current compensation unit includes:
   a second transistor coupled to the power voltage terminal and driven by the charged voltage of the capacitor; and
   a second switch coupled to the second transistor and an output node of the leakage current sensing unit and configured to be closed while in the read mode,
   wherein the second transistor is configured to have a size as large as n-times a size of the first transistor, wherein n=VIN2/VIN1−1, VIN1 is the input voltage, and the VIN2 is the read voltage.

8. The semiconductor integrated circuit device of claim 7, wherein the leakage current sensing unit further includes a conversion unit configured to convert the leakage current to a digital code and store the digital-coded leakage current, wherein the conversion unit includes:
an analog to digital converter (ADC) configured to convert the leakage current generated in the leakage current generation unit to the digital code;
a digital to analog converter (DAC) configured to receive the digital code from the ADC, convert the digital code to an analog value, and provide the analog value to the leakage current compensation unit,
wherein the leakage current compensation unit includes:
a third switch coupled between the DAC and to both a gate of the second transistor and the capacitor, the third switch configured to be closed while in the read mode.

9. The semiconductor integrated circuit device of claim 5, wherein the leakage current sensing unit further includes:
a conversion unit configured to convert the leakage current to a digital code and store the digital-coded leakage current.

10. The semiconductor integrated circuit device of claim 9, wherein the conversion unit includes:
an analog to digital converter (ADC) configured to convert the leakage current generated in the leakage current generation unit to the digital code;
a digital to analog converter (DAC) configured to receive the digital code from the ADC, convert the digital code to an analog value, and provide the analog value to the leakage current compensation unit; and
a leakage storage unit configured to store the digital code.

11. The semiconductor integrated circuit device of claim 10, wherein at least one of the ADC and the DAC is configured to reflect the ratio of the voltage in the read mode to the component of the input voltage and control an output level thereof.

12. A method of operating a semiconductor integrated circuit device, the method comprising:
measuring a leakage current of a cell array;
applying a read voltage of the cell array and comparing a reference current to the leakage current reflected with a read current of the cell array; and
comparing a comparison result with a reference voltage and determining a set state or a reset state of the cell array,
wherein when the cell array includes a crossbar array structure including a plurality of word lines, a plurality of bit lines crossing the plurality of word lines, and variable resistors located at intersections of the word lines and the bit lines,
the measuring of the leakage current includes applying an input voltage less than or equal to a threshold voltage of the cell array and charging a capacitor of a leakage current sensing unit configured of a capacitor loop.

13. The method of claim 12, wherein the reference current, compared to the leakage current reflected with the read current of the cell array, is a current wherein leakage current compensation is performed by reflecting a ratio of a voltage in a read mode to a component of the input voltage to the measured leakage current.

14. The method of claim 13, wherein the leakage current compensation includes summing n-times a leakage current to the measured leakage current, wherein n=VIN2/VIN1−1, VIN1 is the input voltage, and the VIN2 is the read voltage.

15. A semiconductor integrated circuit device comprising:
a cell array including a plurality of word lines, a plurality of bit lines crossing the plurality of word lines, and variable resistors located at interconnections of the word lines and the bit lines;

a mode setting unit configured to set a leakage current sensing mode by applying a first voltage to the cell array, and sets a read mode by applying a second voltage to the cell array;
a reference current generation unit configured to provide a reference current to an output node while in the read mode;
a leakage current generation unit including a capacitor loop, and configured to generate a leakage current according to a charge amount stored in the capacitor loop and transfer the leakage current to the output node while in the leakage current sensing mode;
a leakage current compensation unit configured to reflect a ratio of a voltage in the read mode to a component of the first voltage to the leakage current applied to the output node while in the read mode; and
a determination circuit unit configured to compare a voltage corresponding to a comparison result between a current of the cell array and a current of the output node with a reference voltage and determine a set state or a reset state of the cell array.

16. The semiconductor integrated circuit device of claim 15, wherein the leakage current generation unit includes:
a first transistor coupled to a power voltage terminal and driven by a charged voltage of the capacitor loop; and
a first switch coupled between a gate and a drain of the first transistor and configured to be closed while in the leakage current sensing mode.

17. The semiconductor integrated circuit device of claim 16, wherein the leakage current compensation unit includes:
a second transistor coupled to the power voltage terminal and driven by the charged voltage of the capacitor loop; and
a second switch coupled between the second transistor and the output node and configured to be closed in the read mode,
wherein the second transistor is configured to have a size as large as n-times a size of the first transistor, wherein n=VIN2/VIN1−1, VIN1 is the first voltage, and the VIN2 is the second voltage.

18. The semiconductor integrated circuit device of claim 15, further comprising a current comparison unit configured to compare the current of the output node with the current of the cell array.

19. The semiconductor integrated circuit device of claim 15,
wherein the determination circuit unit is configured to perform a comparison operation in response to a signal, and
wherein the second voltage is delayed by a certain time.

20. The semiconductor integrated circuit device of claim 15, wherein the leakage current sensing unit further includes a conversion unit configured to receive the leakage current, convert the leakage current to a digital code, and store the digital code, and provide the stored digital code to the output node as the leakage current while in the read mode.

21. The semiconductor integrated circuit device of claim 17,
wherein the leakage current sensing unit further includes a conversion unit configured to receive the leakage current, convert the leakage current to a digital code, and store the digital code, and provide the stored digital code to the output node as the leakage current in the read mode,
wherein the conversion unit includes:

an analog to digital converter (ADC) configured to convert the leakage current generated in the leakage current generation unit to the digital code;
a digital to analog converter (DAC) configured to receive the digital code from the ADC, convert the digital code to an analog value, and provide the analog value to the leakage current compensation unit,
wherein the leakage current compensation unit includes:
a third switch coupled between the DAC and to both a gate of the second transistor and the capacitor, the third switch configured to be closed while in the read mode.

22. A semiconductor integrated circuit device comprising:
a cell array including a plurality of word lines, a plurality of bit lines crossing the plurality of word lines, access devices located at intersections of the word lines and the bit lines, and data storage units of resistance values are selectively varied according to operations of the access devices;
a leakage current generation unit including a capacitor loop, and configured to generate a leakage current according to a charge amount stored in the capacitor loop and transfer the leakage current to an output node in a leakage current sensing mode; and
a determination circuit unit configured to compares a voltage corresponding to a comparison result between a current of the cell array and a current of the output node with a reference voltage and configured to determine a set state or a reset state of the cell array in a read mode.

23. The semiconductor integrated circuit device of claim 22, wherein the leakage current generation unit includes:
a transistor coupled to a power voltage terminal and driven by a charged voltage of the capacitor loop; and
a switch coupled between a gate and a drain of the transistor and configured to be closed while in the leakage current sensing mode.

24. The semiconductor integrated circuit device of claim 22, further comprising a current comparison unit configured to compare the current of the output node with the current of the cell array.

25. The semiconductor integrated circuit device of claim 22, further comprising:
a voltage regulator configured to provide a read voltage to the cell array; and
a reference voltage generation unit configured to provide a reference current to the output node while in the read mode.

26. A semiconductor integrated circuit device comprising:
a cell array;
a leakage current generation unit including a capacitor loop, and configured to generate a leakage current according to a charge amount stored in the capacitor loop and transfer the leakage current to an output node while in a leakage current sensing mode;
a conversion unit configured to receive the leakage current, perform digital coding on the leakage current, and store the digital-coded leakage current, and provide the stored leakage current to the output node while in a read mode; and
a determination circuit unit configured to compare a voltage corresponding to a comparison result between a read current provided from the cell array and a current of the output node with a reference voltage and determine a state of read data while in the read mode.

27. The semiconductor integrated circuit device of claim 26, wherein the conversion unit includes:
an analog to digital converter (ADC) configured to convert the leakage current generated in the leakage current generation unit to a digital code;
a digital to analog converter (DAC) configured to receive the digital code from the ADC, convert the digital code to an analog value, and provide the analog value to the output node; and
a leakage storage unit configured to store the digital code.

28. The semiconductor integrated circuit device of claim 27, wherein when a certain voltage is applied to the cell array to measure the leakage current, at least one of the ADC and the DAC is configured to reflect a ratio of a voltage in the read mode to a component of the certain voltage and control an output level of the voltage.

29. A electronic apparatus comprising:
a processor coupled to a bus; and
a memory coupled to a bus and configured to store data for the operation of the processor and data accessed through the bus,
wherein the memory includes a semiconductor integrated circuit device comprising:
a leakage current sensing unit configured to sense a pure leakage current of a cell array; and
a determination circuit unit configured to compare a voltage level of an input node with a reference voltage and determine a state of read data while in a read mode,
wherein the voltage level of the input node is decided by comparing an output current and a read current,
wherein the output current is decided by summing the pure leakage current and a reference current.

* * * * *